United States Patent [19]

Lukens et al.

[11] Patent Number: 4,526,858
[45] Date of Patent: Jul. 2, 1985

[54] METHOD FOR FABRICATING SUPERCONDUCTING WEAK-LINKS USING ELECTRON BEAM LITHOGRAPHY

[75] Inventors: James E. Lukens, Stony Brook; Paul M. Mankiewich, East Setauket, both of N.Y.

[73] Assignee: The United States of America as represented by the Secretary of the Navy, Washington, D.C.

[21] Appl. No.: 338,821

[22] Filed: Jan. 11, 1982

[51] Int. Cl.³ ............................................... G03C 5/00
[52] U.S. Cl. .................................... 430/296; 430/313; 430/315; 430/319; 430/330
[58] Field of Search ............... 430/296, 313, 315, 319, 430/329, 330, 314; 427/63

[56] References Cited

PUBLICATIONS

Berker et al., "Dual-Polarity, Single-Resist Mixed (E-Beam/Photo) Lithography", IEEE Electron Device Letters, vol. 2, EDL-2, No. 11, Nov. 1981, pp. 281-283.
G. J. Dolan, "Offset Masks for Lift-Off Photoprocessing", Applied Physics Letters, vol. 31, No. 5, Sep. 1, 1977, p. 337.
Sato et al., "Submicron Electron-Beam Patterning of Aluminum by a Double-Layer Pattern Transfer Technique", J. Vac. Sci. Technol., 19(4), (Nov./Dec. 1981) pp. 1329-1332.

Primary Examiner—John Kittle
Assistant Examiner—José G. Dees
Attorney, Agent, or Firm—Robert F. Beers; Arthur A. McGill; Prithvi C. Lall

[57] ABSTRACT

A method for fabricating indium variable thickness super conducting microbridges uses a single layer of electron resist and EBL to draw a mask which has a gap with a small amount of undercut. A thin layer of material is deposited at normal incidence to form the bridge and material deposited at a sufficiently large oblique angle forms the banks separately. Typical VTB's have bridges 1000 Å thick and <0.4 μm long with the banks 7 μm thick and $R_n \sim 0.1\Omega$. The method can also form other non-hysteretic weak links such as the SNS junction.

8 Claims, 7 Drawing Figures

METHOD FOR FABRICATING SUPERCONDUCTING WEAK-LINKS USING ELECTRON BEAM LITHOGRAPHY

BACKGROUND OF THE INVENTION

This invention is drawn to the field of sub-micron scale thin film micro-fabrication techniques, and more particularly, to a novel method for fabricating Josephson weak-links employing electron beam lithography.

Non-hysteretic weak-links such as the variable thickness microbridge (VTB) and the SNS junction utilize the AC Josephson effect to produce tunable radiation in the microwave and millimeter wave regions of the electomagnetic spectrum. Reference in this connection may be had to co-pending applications Ser. No. 258,705, filed Apr. 29, 1981, U.S. Pat. No. 4,470,023 and to Ser. No. 258,704, filed Apr. 29, 1981, U.S. Pat. No. 4,468,635, both of which are incorporated herein by reference, which show and describe means and methods for combining superconducting weak-links coherently to produce radiation the linewidth of which scales as $1/N$ and the power of which scales as $N^2$, where N is the number of coherently arrayed junctions.

A photolithographic method, described by Dolan in an article entitled "Offset masks for lift-off photoprocessing", appearing in Volume 31, No. 5, Appl. Phys. Lett., pp. 337-339, (1977), incorporated herein by reference, uses masks offset from the substrate and oblique angle thin film deposition to fabricate a VTB and other superconducting devices. A bi-level mask consisting of a support layer of resist having a thickness $\delta_1$ is overlayed by a second layer of resist having a comparable thickness $\delta_2$. The first layer of the resist is undercut and the overlying second layer of resist contains the pattern information. A second layer of resist in the form of a suspended bar as shown in FIG. 3(a) can be used with two depositions from opposing oblique angles to form a wide varying thickness superconducting microbridge. FIG. 4(a) shows that a second layer of resist in the form of a suspended bar having a break can be used with oblique angle depositon to form a narrow varying thickness microbridge. Reference may be had to an article entitled "Self-aligned thin film structures with 1000 Å resolution", by Howard et al, appearing in Vol. 36, No. 2, Appl. Phys. Lett, pp. 141-143, (1980), incorporated herein by reference, which shows that e-beam lithography can be utilized with such bi-level shadow masks to produce devices having line resolution an order of magnitude better than that obtained with the optical methods.

SUMMARY OF THE INVENTION

In contrast to the above described techniques, the novel method for fabricating superconducting weak-links of the present invention utilizes a single layer of resist and both normal and oblique angle thin-film deposition. Unlike the photolithographic and e-beam methods discussed above, since the single layer of resist is not suspended from the substrate but is in intimate contact therewith, there are no changes in the mask dimensions during deposition or limitations on possible mask topologies. The method of the present invention is simpler to use, has been found to fabricate highly reproducible devices and is less costly and time consuming, but just as reliable, as the above referred to techniques.

Accordingly, it an object of the present invention to fabricate superconducting weak-links using e-beam lithography.

It is another object of the present invention to fabricate reliable and reproducible superconducting weak-links in a manner that is comparatively simple.

Yet another object of the present invention is to fabricate superconducting weak-links with a single layer of resist by using shadowing.

Other objects, advantages and attendant features of the present invention will become apparent by reference to the appended claims, to the following detailed description of the invention and to the drawings, wherein like parts are similarly designated throughout, and wherein:

DETAILED DESCRIPTION OF THE INVENTION

Figure 1:
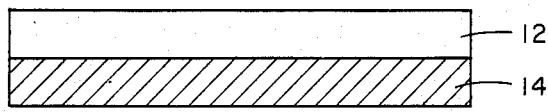
FIGS. 1(a)-1(d) show diagrams in schematic cross-sectional view which are useful in illustrating the steps of the novel method of fabricating superconducting weak-links according to the present invention.
Figure 1:
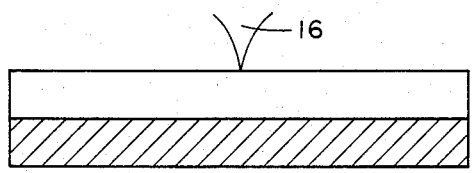
Figure 1:
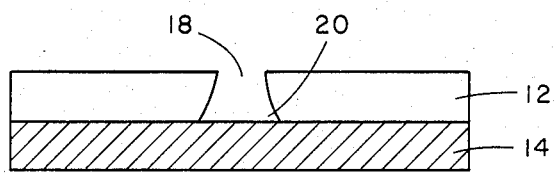
Figure 1:
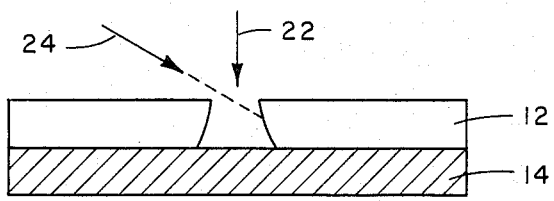

An electron resist 12, preferably polymethylmethacrylate, PMMA, is spun-on a substrate 14, preferably sapphire, as shown in FIG. 1(a). The PMMA resist is prepared by dissolving the polymer in methyl isobutyl ketone.

After spin-coating, the resist-covered substrate is baked at $\simeq 170°$ C. for approximately 45 minutes to improve the adhesion of the resist on the substrate. Typical resist layer thickness is about one (1) micron.

As shown in FIG. 1(b), the substrate is then controllably exposed by a fine electron beam 16, produced by any suitable means such as an Etec Autoscan SEM under computer control, to selectively pattern the single layer of the electron resist 12. The electron beam has a potential of approximately 20 kV and a current of $\simeq 3 \times 10^{-11}$ A. Total dosages are in the range of 350-800 $\mu$C./cm$^2$. As will appear more fully below, the resist 12 is selectively patterned in the form of an "H", where the dimensions of the cross member is substantially smaller than the dimensions of the side members of the "H".

In the irradiated areas, the electron beam breaks the chemical bonds of the PMMA resist reducing the molecular weight in the irradiated areas. The resist is then developed in any suitable solvent such a 2:3 mixture of Prapenal to MIK for $\simeq 20$ seconds. Because of electron back scattering off the substrate and the reduced molecular weight in the irradiated areas, the selectively patterned and etched resist 12 is thus provided with a gap 18 having a small amount of undercut 20 as shown in FIG. 1(c).

Referring now to FIG. 1(d), to fabricate a variable thickness microbridge using the above described single layer of resist as a masking element, first superconducting metal atoms are evaporated onto the resist/substrate assembly at a normal incidence 22 to form a thin layer of material on the substrate.

Figure 2:
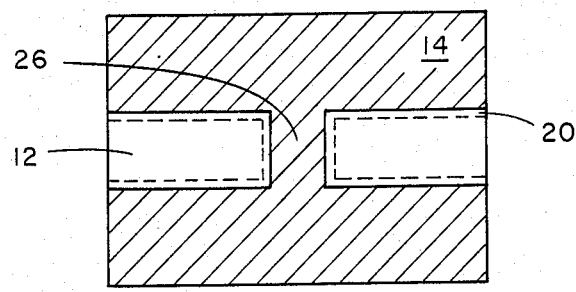
FIGS. 2(a)-2(b) show diagrams in schematic plan view which are useful in illustrating the novel method of fabricating superconducting weak links according to the present invention.
Figure 2:
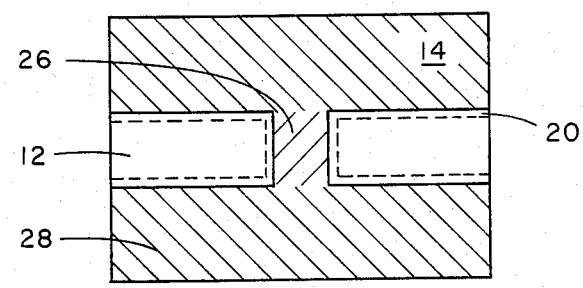

A second layer of superconducting metal atoms is evaporated onto the substrate/resist assembly at such an oblique angle 24 that the material does not deposit on the substrate in the bar of the "H" but only in the two legs of the "H". The normal incidence deposition of material forms the bridge 26, i.e. the bar of the "H", as shown in FIG. 2(a), and the oblique angle deposition of material forms the banks 28 of the VTB, i.e. the legs of the "H" as shown in FIG. 2(b). It will be appreciated that although the deposited material covers the resist 12 this has not been illustrated for clarity of presentation. The directed material, preferably of In, can be deposited by any suitable technique such as vacuum deposition or ion milling.

Figure 3:
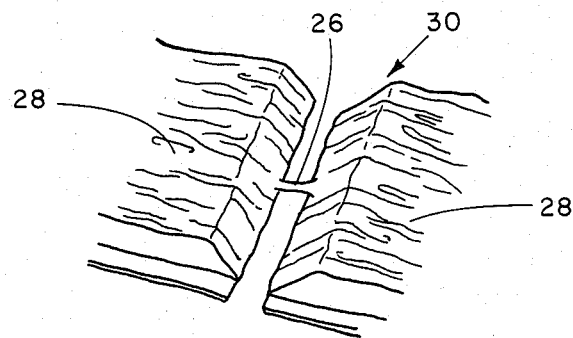
FIG. 3 shows a perspective view of a VTB fabricated by the novel method of the present invention.

The resist and overlaying metal films are then lifted-off using a suitable solvent such as acetone leaving on the substrate 14 a variable thickness microbridge generally designated at 30 as shown in FIG. 3. It is noted that the lumpiness of the Indium is a product of deposition at a 45° angle. Typical VTB's fabricated by the present invention have bridges 1000 Å thick and <0.4 μm long with the banks 0.7 μm thick and $R_n \sim 0.1 \Omega$.

Many modifications of the presently disclosed method for fabricating superconducting weak-links may be effected without departing from the inventive concept. For example, a negative rather than a positive electron resist such as poly(butadino) may be utilized; a beam of non-superconducting atoms such as gold may be directed onto the substrate at the normal incidence to fabricate a SNS non-hysteretic weak-link and X-ray or ion beam lithography can be employed.

In summary, the novel method of the present invention fabricates superconducting weak-links using only a single layer of selectively patterned and etched resist as a mask and normal and oblique angle thin film deposition. The method fabricates the VTB and other superconducting weak-links in a comparatively simple yet reliable and reproducible way using electron beam lithography.

What is claimed is:

1. A method for fabricating non-hysteretic weak-links, comprising the steps of:
    obtaining a substrate;
    overlaying on said substrate a single film of an electron resist material forming an assembly;
    heating said assembly at a predetermined temperature for a preselected time;
    controllably exposing selected regions of said electron resist with a fine electron beam;
    developing said selectively exposed electron resist in a solvent for forming a mask having an "H" shape where the cross member of the "H" is a gap having an undercut profile;
    directing a first stream of metallic atoms at normal incidence to said mask to form a first layer of metal on said substrate in the region of the cross member of the "H";
    directing a second stream of metallic atoms at such an oblique angle of incidence to said mask that said second stream of metal atoms forms a second layer of metal on said substrate in the region of the side members of the "H"; and
    lifting-off the resist mask;
    whereby, a non-hysteretic weak-link is fabricated.

2. A method for fabricating non-hysteretic weak-links, as recited in claim 1, wherein said first stream of metallic atoms are superconducting and said non-hysteretic weak-link is a VTB.

3. A method for fabricating non-hysteretic weak links, as recited in claim 1, wherein said first stream of metallic atoms are non-superconducting and said non-hysteretic weak-link is a SNS junction.

4. A method for fabricating non-hysteretic weak links, as recited in claims 2 or 3, wherein said electron resist is PMMA.

5. A method for fabricating a VTB having a bridge member and bank members, comprising the steps of:
    applying a single thin film layer of an electron resist to a substrate;
    using a fine electron beam to selectively pattern said electron resist film;
    etching said selectively patterned electron resist film to form an "H" shaped mask having an undercut-profile gap;
    depositing on said substrate a first metal film at normal incidence to said mask to form said superconducting bridge in the region of the cross member of said "H" shaped mask;
    depositing on said substrate a second metal film at such an oblique angle to said mask that said second film forms said banks in the regions of the side members of said "H" shaped mask; and
    lifting-off said mask.

6. A method for fabricating a VTB having a bridge member and bank members, as recited in claim 5, wherein said electron resist is a positive-resist.

7. A method for fabricating a VTB having a bridge member and bank members, as recited in claim 5, wherein said electron resist is a negative-resist.

8. A method for fabricating a VTB having a bridge member and bank members, as recited in claims 6 or 7, wherein said deposited metal films are of In.

* * * * *